(12) United States Patent
Mueller et al.

(10) Patent No.: US 7,352,233 B1
(45) Date of Patent: Apr. 1, 2008

(54) EFFICIENT THYRISTOR-TYPE POWER SWITCHES

(76) Inventors: Otward Mueller, 96 Sweet Rd., Ballston Lake, NY (US) 12019; Eduard K. Mueller, 96 Sweet Rd., Ballston Lake, NY (US) 12019; Michael J. Hennessy, 9 Patroon Pl., Ballston Lake, NY (US) 12019

( * ) Notice: Subject to any disclaimer, the term of this patent is extended or adjusted under 35 U.S.C. 154(b) by 236 days.

(21) Appl. No.: 11/151,508

(22) Filed: Jun. 13, 2005

Related U.S. Application Data

(60) Provisional application No. 60/579,085, filed on Jun. 14, 2004.

(51) Int. Cl.
*H03K 17/72* (2006.01)
(52) U.S. Cl. ...................... 327/438; 327/440
(58) Field of Classification Search ........ 327/438–441, 327/450, 461, 464
See application file for complete search history.

(56) References Cited

U.S. PATENT DOCUMENTS

| | | | |
|---|---|---|---|
| 4,581,543 A | * | 4/1986 | Herberg ..................... 327/438 |
| 4,682,278 A | * | 7/1987 | Marquardt et al. ........... 363/58 |
| 6,163,200 A | * | 12/2000 | Iijima ......................... 327/438 |
| 6,933,541 B1 | * | 8/2005 | Huang ......................... 257/177 |
| 2001/0043111 A1 | * | 11/2001 | Gonthier et al. ............ 327/531 |
| 2003/0168671 A1 | * | 9/2003 | Huang et al. ................ 257/157 |

FOREIGN PATENT DOCUMENTS

| | | | |
|---|---|---|---|
| JP | 57183269 A | * | 11/1982 |
| JP | 06165371 A | * | 6/1994 |
| JP | 08033311 A | * | 2/1996 |

* cited by examiner

*Primary Examiner*—Quan Tra
(74) *Attorney, Agent, or Firm*—Leonard Cooper

(57) ABSTRACT

The highest-power switches now available are based on thyristor-type devices: GTOs (Gate turn-off thyristors), MTOs (MOS controlled turn-off thyristors), IGCTs (Integrated gate commutated thyristors), and the new ETOs (Emitter turn-off thyristors). These devices handle kilovolts and kiloamperes for megawatt inverters/converters. Measurements by the inventors show that conduction losses of MOSFETs and switching losses of IGCTs are drastically decreased by cryo-cooling. IGCTs, ETOs, and MTOs, together with many small, low voltage MOSFETs for gate and emitter turn-off circuitry, are cryo-cooled to attain much higher switching speeds and a reduction in size, weight and cost of high-power (megawatt range) equipment.

7 Claims, 2 Drawing Sheets

EFFICIENT THYRISTOR-TYPE POWER SWITCHES

This patent claims the benefit of provisional patent application 60/579,085 filed Jun. 14, 2004.

BACKGROUND OF THE INVENTION

Combining GTOs (Gate Turn-Off thyristor) with MOSFETs yields new devices, including IGCTs (Integrated Gate Commutated Thyristors) and ETOs (Emitter Turn-Off thyristors). While these devices promise very high switching powers, they are relatively slow and exhibit high switching and conduction losses.

FIGS. 1 and 2 show diagrams of an IGCT and an ETO. The measurements shown in the original data of FIG. 3 demonstrate how the critical turn-off times decrease with decreasing temperature of a IGCT thyristor switch [Ref. 2]. It was earlier known that GTOs provide similar improved performance at reduced temperatures. Turn-on and delay times (not shown) are also improved. Many additional measurements on IGCTs and MTOs (MOSFETs in gate turn-off circuitry) are presented in reference 2, which is an unpublished report prepared by the inventors. These FIG. 3 curves demonstrate how decreasing the operating junction temperature improves performance.

The measurements in FIG. 3 were made cooling only the power device, the basic thyristor switch GTO. The driver circuitry was not designed for operation at cryogenic temperatures, and so was not cooled.

SUMMARY OF THE INVENTION

Many conventional circuit devices, especially those utilized in the driver circuitry, have been found to be inoperative at cryogenic temperatures. Additional advantages are obtained when thyristor drive circuits do incorporate selected components enabling performance at cryogenic temperatures.

The cryo IGCT (FIG. 1) of the present invention drastically improves the performance of a conventional GTO by using selected components, cooling the device, and enforcing a "unity gain turn-off" gate current (gate turn-off current=anode current) using many MOSFETs situated in the gate turn-off circuitry (driver) and by reducing the gate loop circuit lead inductance.

The cryo ETO (Emitter Turn-Off thyristor) (FIG. 2) in accordance with the invention goes a step further and adds a low-voltage MOSFET switch in series to the cathode of an IGCT type (FIG. 1) device [1]. Thus, the ETO contains not one but two functionally essential MOSFET switches. Although the series MOSFETs add the MOSFET on-resistance voltage drop to the switch on-state voltage, by paralleling many low-voltage MOSFETs, this add-on resistance is made small.

Cryogenically cooling semiconductor devices can increase their switching speeds. The inventors have shown that the on-resistance of certain low-voltage (<100V) MOSFETs improves by a factor of approximately 8 to 10 when the MOSFETs are cooled from 400 K to 77 K (liquid nitrogen). Since the IGCT has one MOSFET switch and the ETO has two essential MOSFET switches, one in the gate and one in the emitter circuits, respectively, cryo-cooling the entire device including drive circuitry provides many benefits, including lower conduction losses, reduced switching losses, and higher-frequency operation.

The results are two new devices: The Cryo-IGCT and the Cryo-ETO (or SETO, as it is sometimes identified). These devices should accommodate the megawatt power range in many applications with reduced size, weight and cost, especially in all pulsed and low duty cycle applications, where the required refrigeration is lower. Due to the fact that the thermal conductivity of silicon and the substrate materials increases considerably with decreasing temperatures, conventional problems with hot spots and unequal current density distributions across the large thyristor chips (disks up to 90 mm in diameter by current production techniques) should also be alleviated by cryo-cooling. Problems related to di/dt and dv/dt should also be reduced. Another primary advantage of the cryo-IGCT and cryo-ETO is that these devices are compatible with superconducting devices and cables and therefore eliminate transitions between high and low temperatures.

Instead of cryogenically cooling the entire ETO or IGCT, it can also be beneficial to cool portions of the device while keeping other parts warm. Alternatively, a second GTO may be added in a circuit branch parallel to the original device, with each GTO in the circuit performing a separate function, for example, one GTO switching voltage and current, and the other conducting current. This concept, hybrid switch, is the subject of a filed patent application [3] disclosing its application to various other circuit types and devices.

The hybrid switch methodology can also be applied to the ETO. In the HY-SETO device shown in FIG. 4, the switching function is accomplished using a cryo-cooled GTO, and the on-state conduction is handled by a second GTO that is warmer, e.g. approximately room temperature. The two GTOs are in similar ETO circuit branches that are connected in parallel. All emitter and gate MOSFET switches in FIG. 4 are cryo-cooled. High switching losses are a problem in all high-voltage thyristor-type circuits; here the increased switching speed of the Cryo-ETO at low temperatures alleviates these losses. In instances where the switching frequency is high, it may be beneficial to reverse the roles of the warm and cold GTOs, allowing the cryogenic GTO to conduct current while the warm GTO attends to the switching.

DESCRIPTION OF PREFERRED EMBODIMENTS

Figure 1:
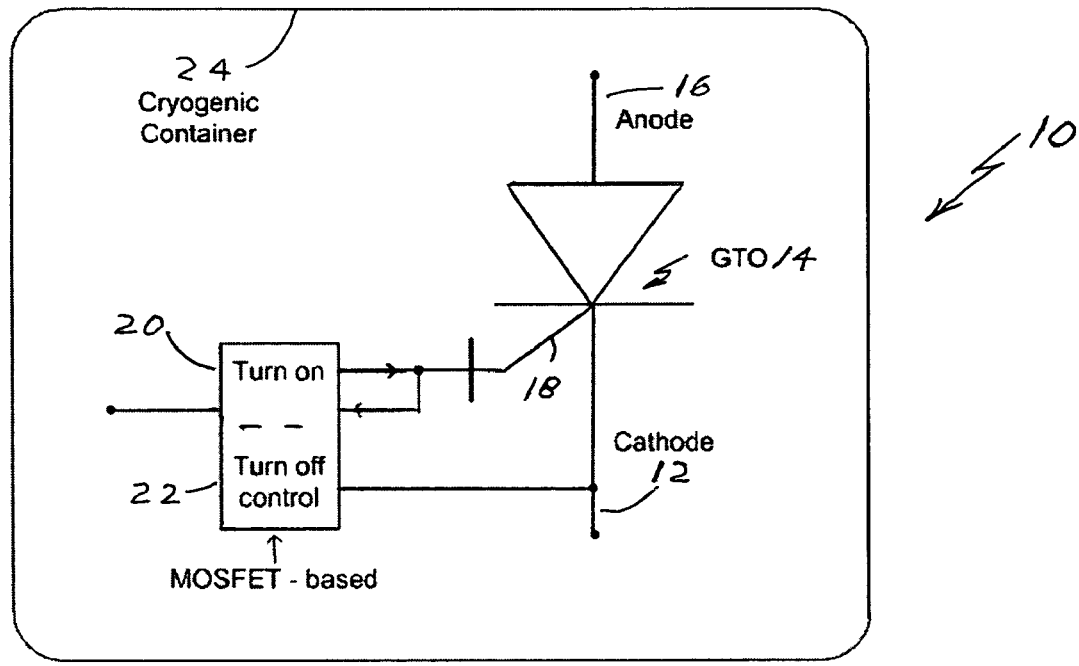
FIG. 1 is a functional block diagram of the Cryo-IGCT (Integrated Gate-Commutated Thyristor) in accordance with the invention.
Figure 2:
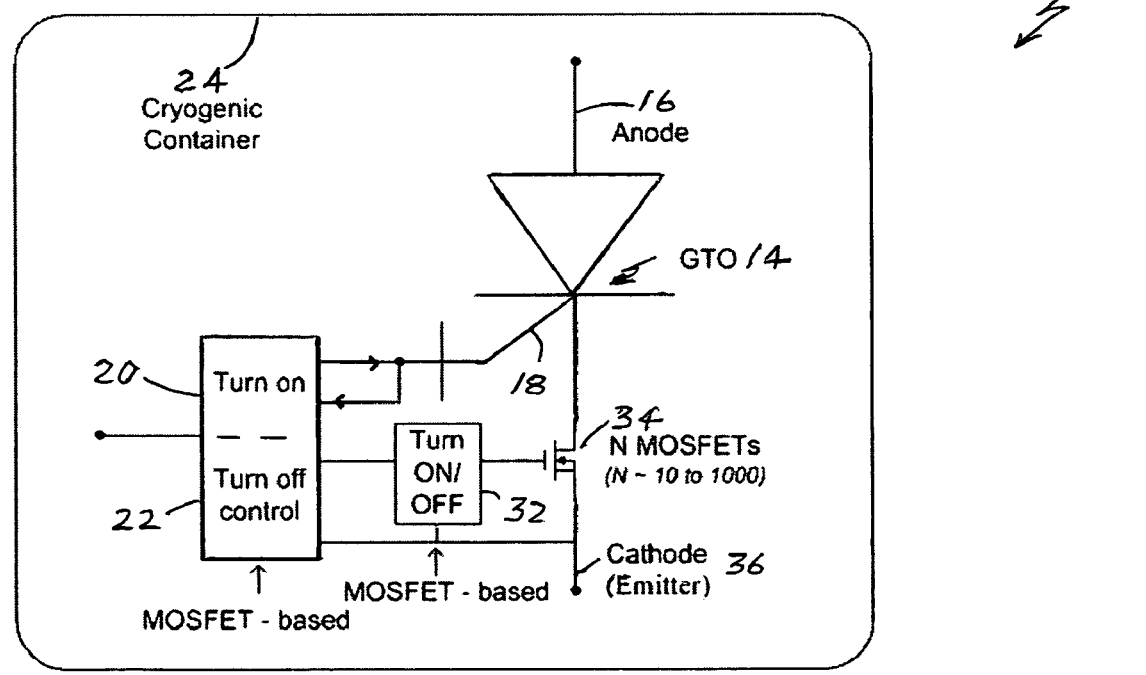
FIG. 2 is a functional block diagram of the Cryo-ETO (Emitter Turn-Off Thyristor) in accordance with the invention.
Figure 3:
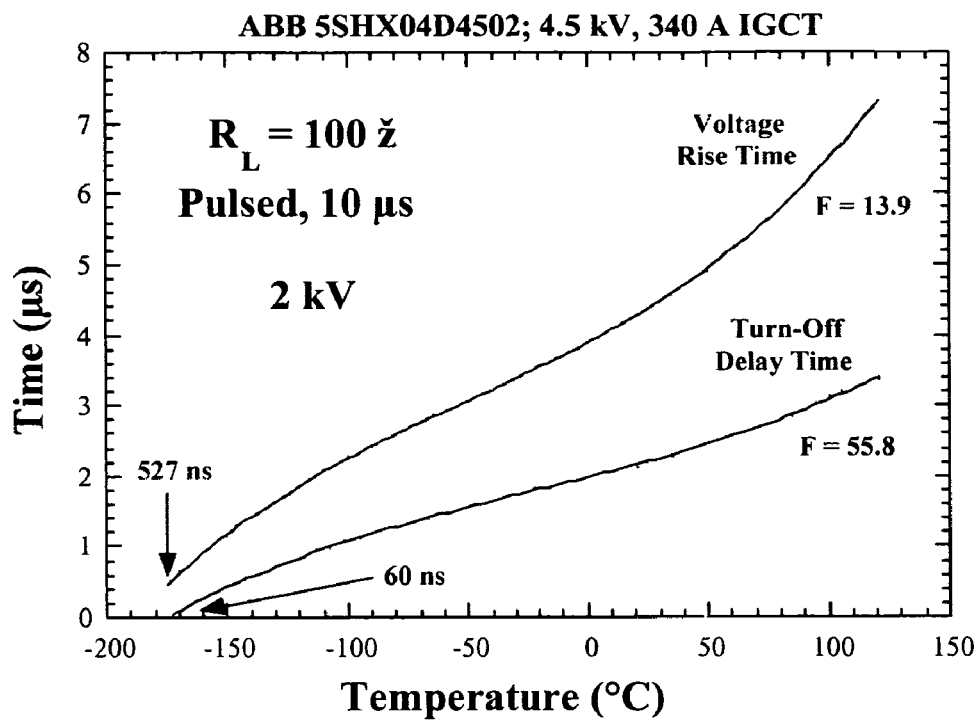
FIG. 3 is a graph of IGCT turn-off time (voltage rise time) and delay time as a function of temperature for a current of 20 A and a voltage of 2000 VDC.

FIG. 1 is a functional block diagram of a Cryo-IGCT 10 and FIG. 2 is a Cryo-ETO 30 (also called a Super-ETO, or SETO). Each device is controlled by turn-on circuitry 20 and turn-off circuitry 22; both control circuits are best implemented using MOSFETs. The gate-cathode loop (18,12 and 18,36) inductance (not shown) is made as small as is physically possible. A gate turn-off thyristor (GTO) 14, made, e.g., of large circular silicon disks, is the main power switch. Features of the IGCT 10 and the ETO 30 are the "unity current gain turn-off" MOSFET driver circuits 20,22 (gate turn off current equals anode current).

For the ETO 30 (FIG. 2), several (N) paralleled low-voltage MOSFETs 34 (only one MOSFET 34 is illustrated to reduce drawing complexity) are series-connected to the cathode/emitter 36 of the GTO 14. The MOSFETs 34 are driven by the MOSFET-based drive circuit 32. (See U.S. application Ser. No. 10/857,118, ELAMP power systems, which is incorporated herein by reference.) The entire assembly, in each embodiment 10,30 is placed in a cryogenic container 24, whereby the entire circuit assembly is cooled below room temperature, preferably to a cryogenic level where performances are enhanced. Cooling can be by liquid immersion or by conduction.

The complete IGCT or ETO circuit is held in a cryogenic container 24, that is cooled, for example, immersed in cryogenic, liquid or gaseous, nitrogen, oxygen, argon, neon, helium, or other cryogenic fluids such as C8F8, or is conduction cooled to any suitable cryogenic temperature. The components, which are selected for their ability to perform at cryogenic temperatures, may alternatively be mounted to a heat sink and conduction cooled by coolant circulated through or over the sink by an external refrigerating system. Thermoelectric cooling elements may be used.

In this patent application, "cryogenic temperature" (cryo) is considered to be approximately 250 K and below. Systems have been constructed that demonstrated enhanced performance in the range of 77K to 250K, which range utilizes the relative economic advantage of liquid nitrogen (77K). Lower temperatures may be used. The cooling systems and coolants, which may be selected and utilized in making and using the present inventions, are not considered to be novel features, per se, of the present invention. Other factors, for example, size, weight, cost, coolant availability, system reliability, etc., may be decisive in such selection decisions so long as cryogenic temperature requirements are met.

The inventors have found in their testing that components and circuits that operate well in conventional environments, e.g. room temperature, may fail to function at cryogenic temperatures. Nevertheless, some components do continue to function at cryo temperatures, and some of these have enhanced performance as discussed above. Capacitors that are typically used in high energy driver circuitry are most likely to be inoperative at cryo temperatures, especially liquid filled components. Thin ceramic capacitors, film capacitors, and solid electrolytic capacitors were found to be more likely to operate well at cryogenic temperatures. Cryogenically qualified components are available from CryoCircuits LLC, Ballston Spa, N.Y. 12020.

Figure 4:
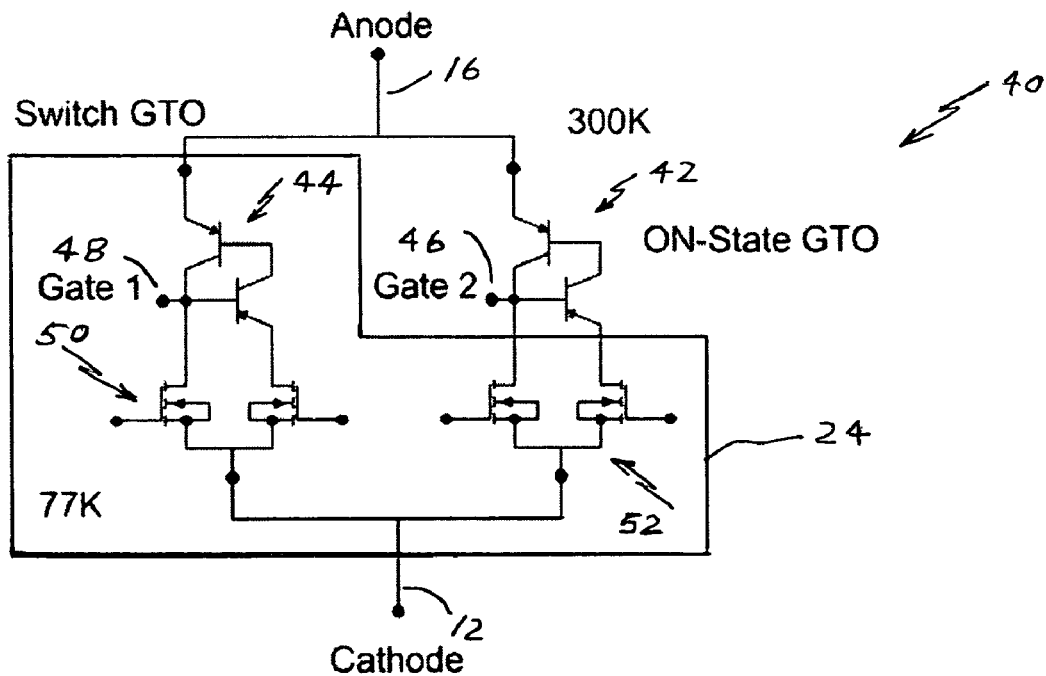
FIG. 4 is an exemplary circuit diagram of the HY-SETO concept in accordance with the invention.

In another embodiment 40 (FIG. 4 HY-SETO), a ETO 44 is cryogenically cooled in the container 24 and is electrically in a branch parallel with a second ETO 42, whose GTO is maintained outside the container 24 at a higher temperature. Both ETOs have their gate and emitter MOSFET circuitry 50,52 cryogenically cooled in the container 24. The cryogenic ETO 44, controlled at Gate 1 (48), switches voltage/current during on-time while the second ETO 42, controlled at Gate 2 (46), handles the opposite function, i.e. conducting current. Alternatively, the cryogenic ETO 44, controlled at Gate 1 (48), is used to conduct current during on-time while the second ETO 42, controlled at Gate 2 (46), handles the opposite function, i.e. switching voltage/current. The MOSFET circuitry of the second ETO 42 could, alternatively, be kept warm, not in the container 24, if that construction were easier to achieve physically.

REFERENCES

1. Bin Zhang, et al.: "The High Power and High Frequency Operation of the Emitter Turn-Off (ETO) Thyristor". CPES 2004 Power Electronics Seminar Proceedings, VPI Blacksburg, Va., Apr. 18-20, 2004, pp. 469-474.
2. MDA SBIR Interim Phase Final Report (unpublished), May 2002, Chapters 5 and 6 (MTECH Labs, Ballston Spa, N.Y. 12020).
3. Hennessy, M. J. and Mueller, E. K.: Hybrid Switch, U.S. patent application Ser. No. 10/670,810.

What is claimed is:

1. A thyristor-type power switch having enhanced performance characteristics at temperatures below room ambient, comprising:
    a first thyristor power switch having an anode, cathode, and control gate;
    a first driver circuit connected between said gate and cathode for operation in control of turn-on and turn-off of said first power switch, said first driver circuit having enhanced performance characteristics at temperatures below room ambient;
    a second thyristor power switch connected electrically in parallel with said first thyristor power switch and having an anode, cathode, and control gate;
    a second driver circuit connected between said gate and cathode for operation in control of turn-on and turn-off of said second power switch;
    a cooling unit for maintaining said first power switch and said first driver circuit below room ambient temperature, said second power switch being maintained at a higher temperature than said first power switch.

2. A thyristor-type power switch as in claim 1 wherein at least one of said first power switch and said second power switch comprises a GTO-based power switch.

3. A thyristor-type power switch as in claim 1 wherein said second driver circuit of said second power switch is cryogenically cooled while said second power switch is maintained at a higher temperature than said first power switch.

4. A thyristor-type power switch as in claim 1 wherein said first power switch conducts current, and said second power switch switches voltage and current.

5. A thyristor-type power switch as in claim 1 wherein said first power switch switches voltage and current, and said second power switch conducts current.

6. A thyristor-type power switch as in claim 2, wherein said at least one GTO-based power switch includes ETO circuitry to provide turnoff by interrupting cathode current.

7. A thyristor-type power switch as in claim 1, wherein at least one of said first driver circuit and said second driver circuit includes MOSFETS.

* * * * *